US012300931B2

(12) United States Patent
Li et al.

(10) Patent No.: US 12,300,931 B2
(45) Date of Patent: May 13, 2025

(54) DUAL IN-LINE MEMORY MODULE (DIMM) SOCKET THAT PREVENTS IMPROPER DIMM RELEASE

(71) Applicant: Intel Corporation, Santa Clara, CA (US)

(72) Inventors: Xiang Li, Portland, OR (US); George Vergis, Portland, OR (US)

(73) Assignee: Intel Corporation, Santa Clara, CA (US)

(*) Notice: Subject to any disclaimer, the term of this patent is extended or adjusted under 35 U.S.C. 154(b) by 817 days.

(21) Appl. No.: 17/352,211

(22) Filed: Jun. 18, 2021

(65) Prior Publication Data
US 2021/0313743 A1 Oct. 7, 2021

(51) Int. Cl.
H01R 13/633 (2006.01)
H01R 12/73 (2011.01)
H01R 13/635 (2006.01)

(52) U.S. Cl.
CPC ....... H01R 13/6335 (2013.01); H01R 12/737 (2013.01); H01R 13/635 (2013.01); H01R 2201/06 (2013.01)

(58) Field of Classification Search
CPC ............... H01R 13/629; H01R 13/633; H01R 13/6335; H01R 13/635; H01R 12/72; H01R 12/73; H01R 12/732; H01R 12/735; H01R 12/737; H01R 2201/06
USPC ......................................................... 439/160
See application file for complete search history.

(56) References Cited

U.S. PATENT DOCUMENTS

| 5,967,811 | A | 10/1999 | Yamamoto et al. |
| 7,029,307 | B1 | 4/2006 | Ling et al. |
| 2006/0042821 | A1 | 3/2006 | Pax |
| 2015/0004824 | A1 | 1/2015 | Nguyen et al. |
| 2020/0144748 | A1 | 5/2020 | Tan et al. |
| 2021/0021089 | A1 | 1/2021 | Li et al. |
| 2021/0313743 | A1* | 10/2021 | Li .......................... G06F 1/185 |

FOREIGN PATENT DOCUMENTS

JP  H08148223 B  4/1999

OTHER PUBLICATIONS

Dutch Search Report for Patent Application No. 2031930, Mailed Mar. 28, 2023, 12 pages.
International Search Report and Written Opinion for PCT Patent Application No. PCT/US22/21980, Mailed Jul. 15, 2022, 10 pages.

* cited by examiner

Primary Examiner — Khiem M Nguyen
(74) Attorney, Agent, or Firm — Compass IP Law PC

(57) ABSTRACT

An apparatus is described. The apparatus includes a dual-in line memory module (DIMM) socket having a first latch and a second latch. One of the first latch and the second latch having a feature for a user to apply force to release a DIMM from the DIMM socket. The other of the first latch and the second latch not having a feature for the user to apply force so that one end of the DIMM releases before an opposite end of the DIMM during release of the DIMM from the DIMM socket.

14 Claims, 15 Drawing Sheets

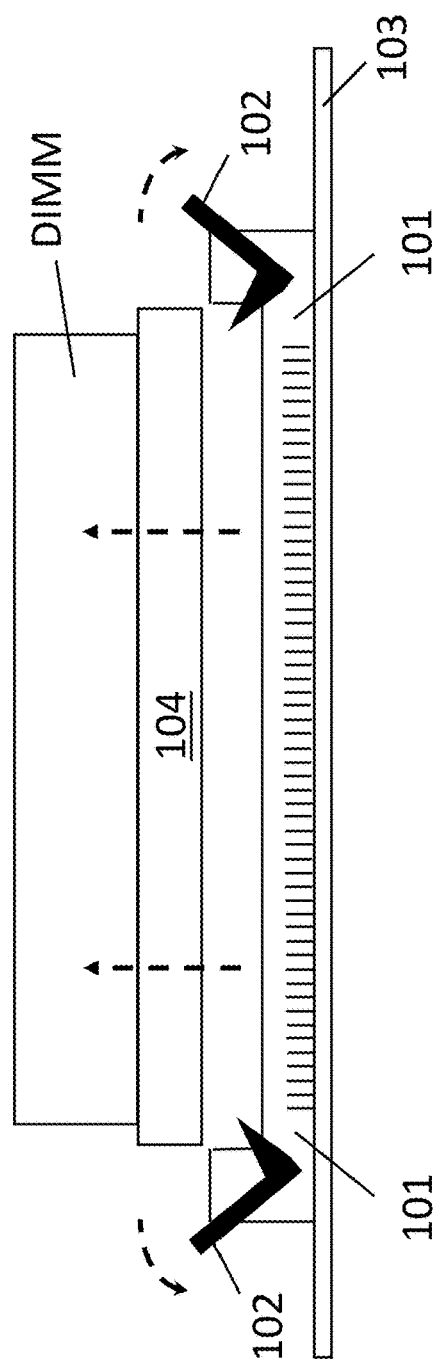

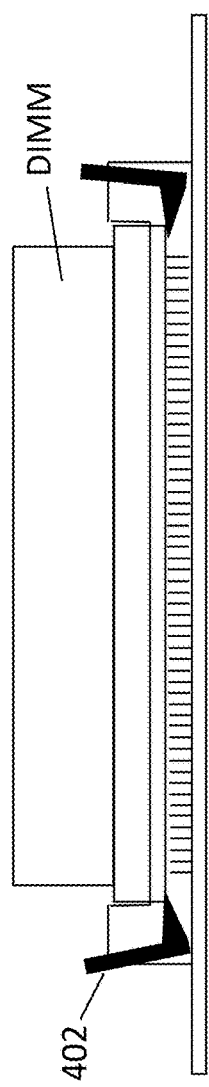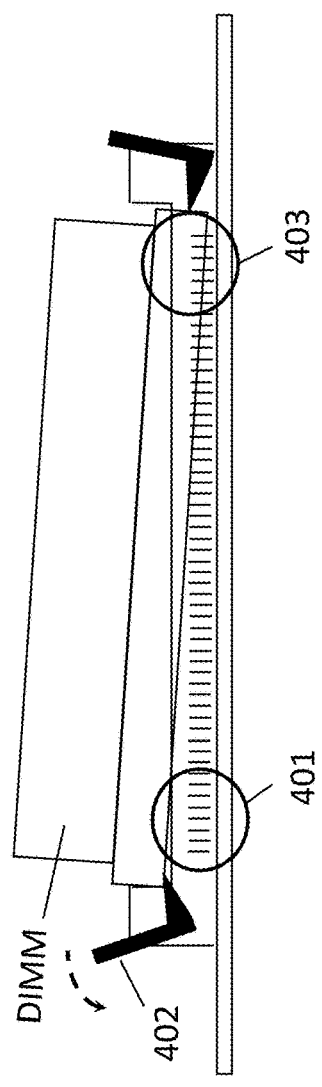

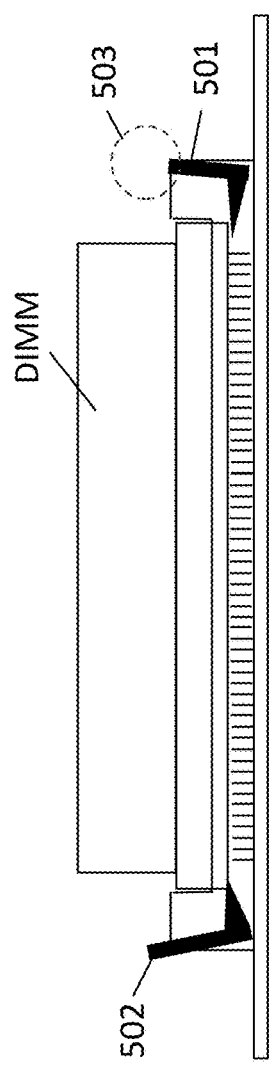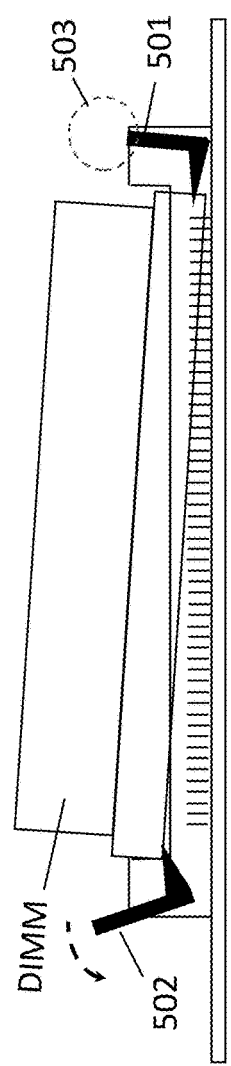
Fig. 5a
Fig. 5b

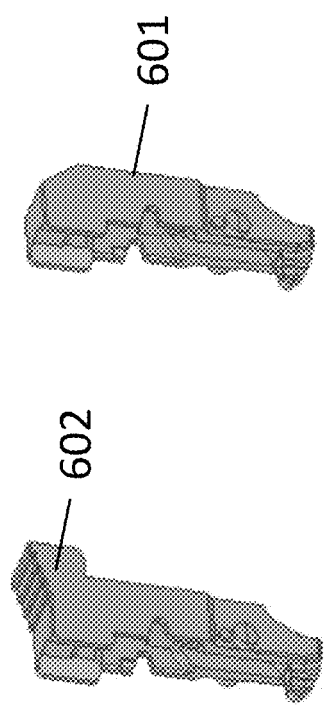

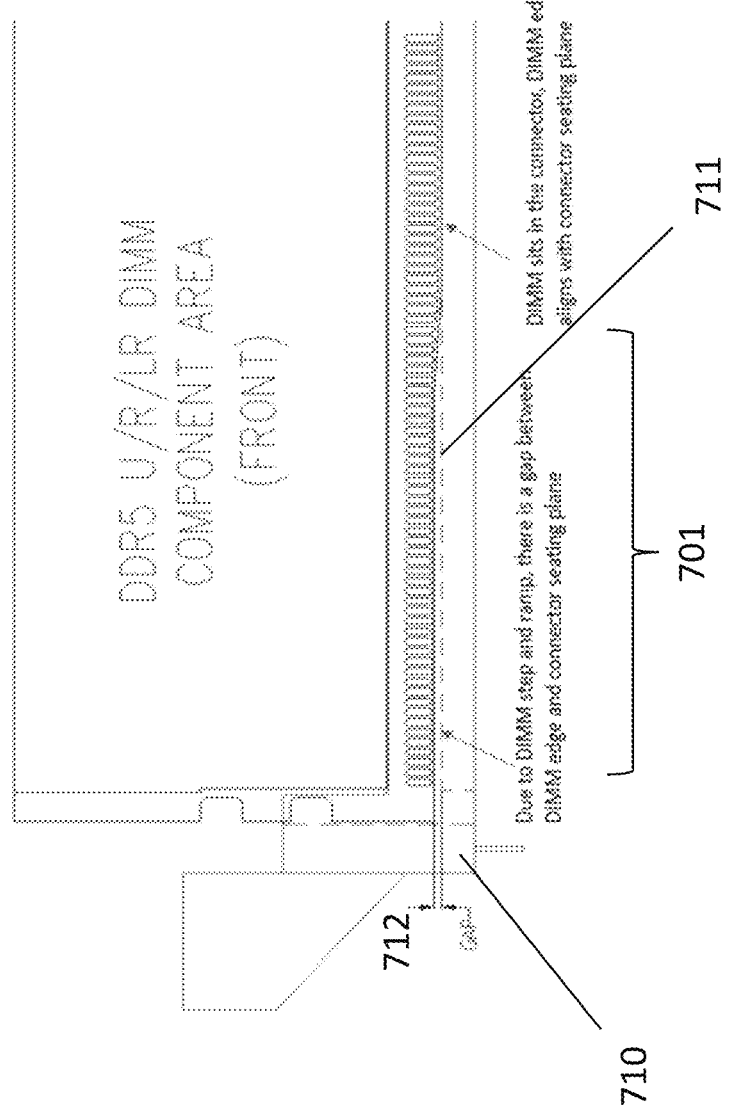

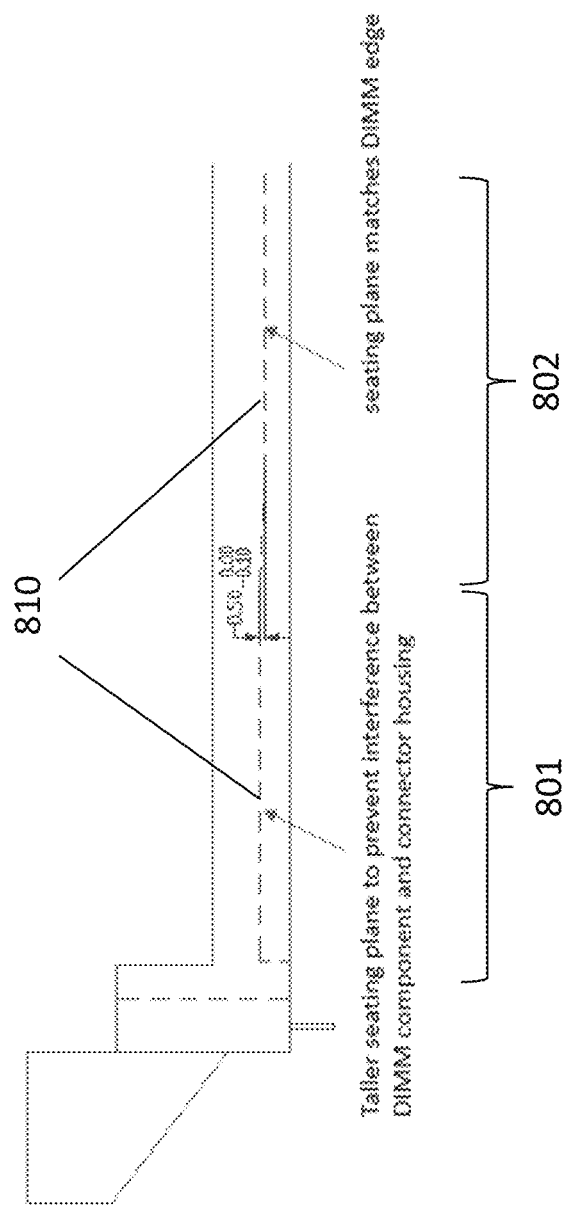

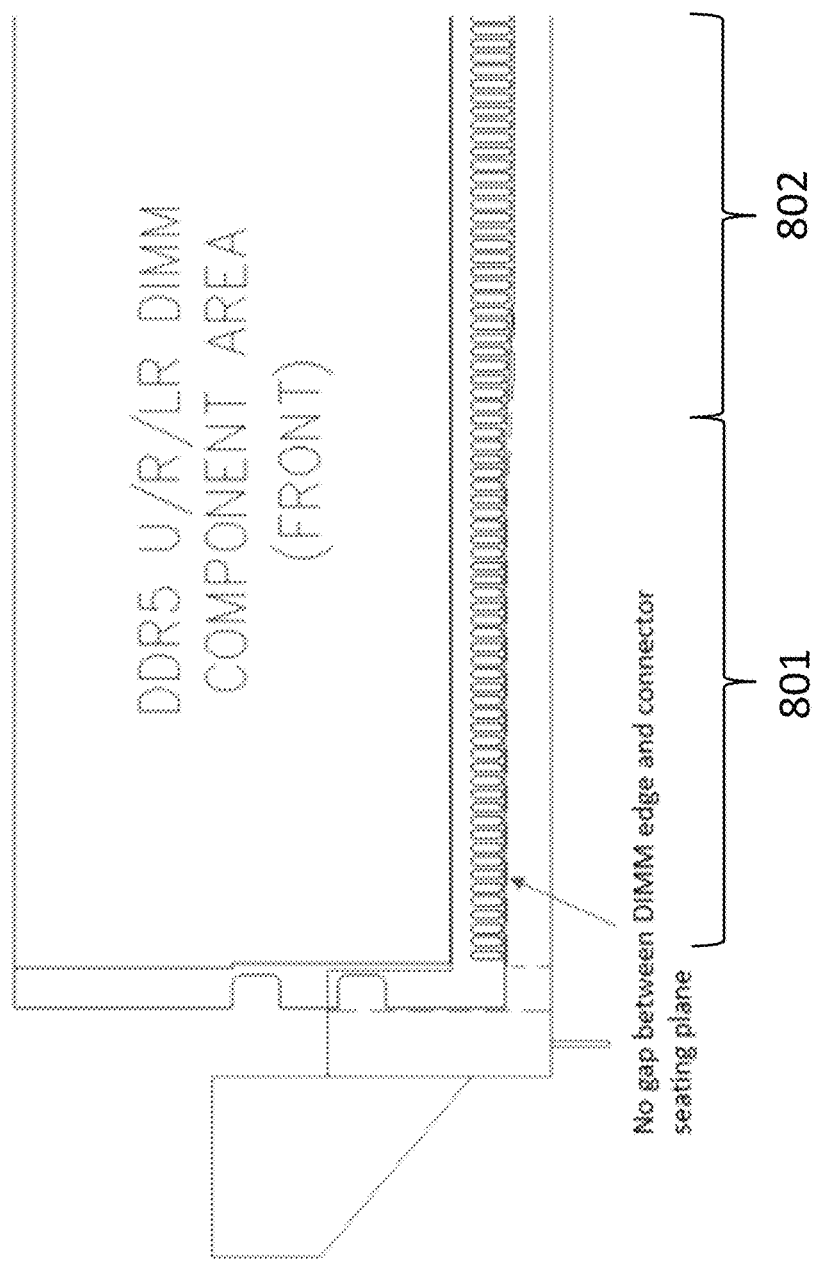

DUAL IN-LINE MEMORY MODULE (DIMM) SOCKET THAT PREVENTS IMPROPER DIMM RELEASE

FIELD OF INVENTION

The field of invention pertains to the electrical-mechanical arts, and, in particular, pertains to a DIMM socket that prevents improper DIMM release.

BACKGROUND

Increased performance of computing systems is frequently achieved by integrating more signal wires into smaller and smaller form factors. An area of concern is the electro-mechanical coupling of a memory module, such as a dual in-line memory module (DIMM), to a motherboard or other base electronic circuit board. Here, as the distance between I/Os becomes shorter and/or the number of I/Os increases, failure mechanisms of the module/board attachment are likely emerge.

FIGURES

A better understanding of the present invention can be obtained from the following detailed description in conjunction with the following drawings, in which:

FIGS. 1a, 1b and 1c show a standard DIMM/motherboard connection and release dynamic;

FIGS. 4a and 4b show a second uneven DIMM release dynamic;

FIGS. 5a and 5b show detailed views of an embodiment of a DIMM socket with latches that prevents improper release of a DIMM;

FIG. 6 shows an embodiment of latch without a push tab;

FIGS. 7a, 7b and 7c depict a seating problem with a DIMM;

FIGS. 8a and 8b depict a solution to the seating problem of FIGS. 7a, 7b and 7c;

DETAILED DESCRIPTION

Figure 1A:
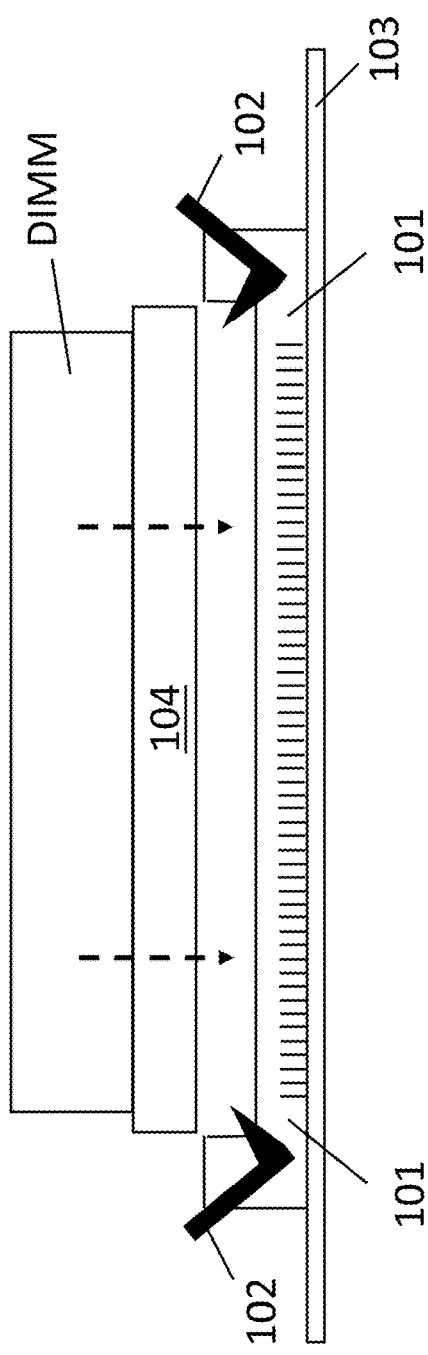
Figure 1B:
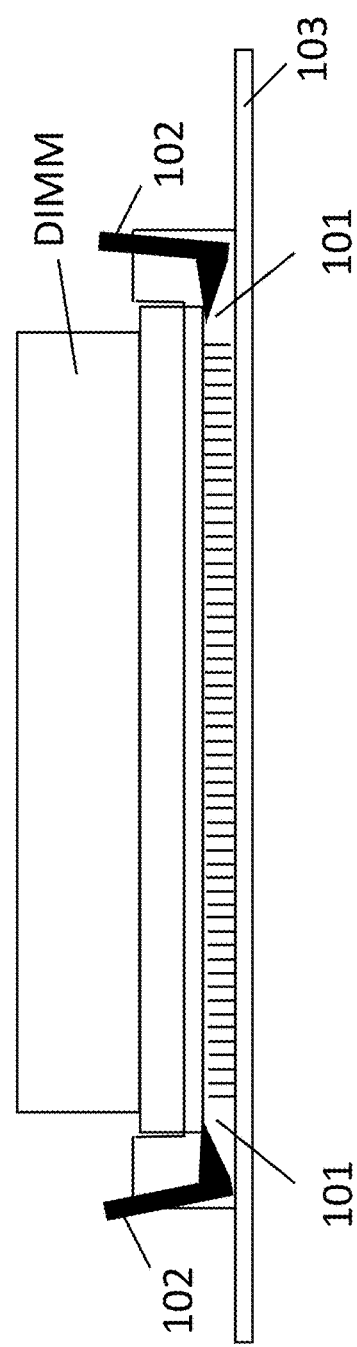

FIGS. 1a, 1b and 1c depict a standard DIMM/motherboard attachment mechanism. As observed in FIG. 1a, a socket housing 101 having an integrated release latch 102 on each side of the socket housing 101 is mounted to a motherboard 103. I/O pins point upward from the bottom of the socket housing 101 and mate to openings in the bottom of the DIMM's connector element 104. As the DIMM is pressed into the socket housing 101, referring to FIG. 1b, the lever arms of the release latches 102 close and remain in the closed position while the DIMM is securely mounted to the socket housing 101 and motherboard 103.

In order to release the DIMM from the socket housing 101, referring to FIG. 1c, a user pushes the lever arms outward which rotates the latches and pushes the bottom of the DIMM upward thereby releasing the mechanical connection between the socket pins and the openings at the bottom of the DIMM connector element 104.

A failure mechanism has been discovered with respect to the DIMM/socket connection of a Joint Electron Device Engineering Council (JEDEC) Dual Data Rate 5 (DDR5) memory implementation. In particular, if the DIMM is not evenly released, but rather, has some rotation associated with its release from the socket, rotation of the DIMM while the DIMM is latched into the socket which, in turn, can cause mechanical damage to at least some of the I/O pins of the socket housing.

Figure 2:
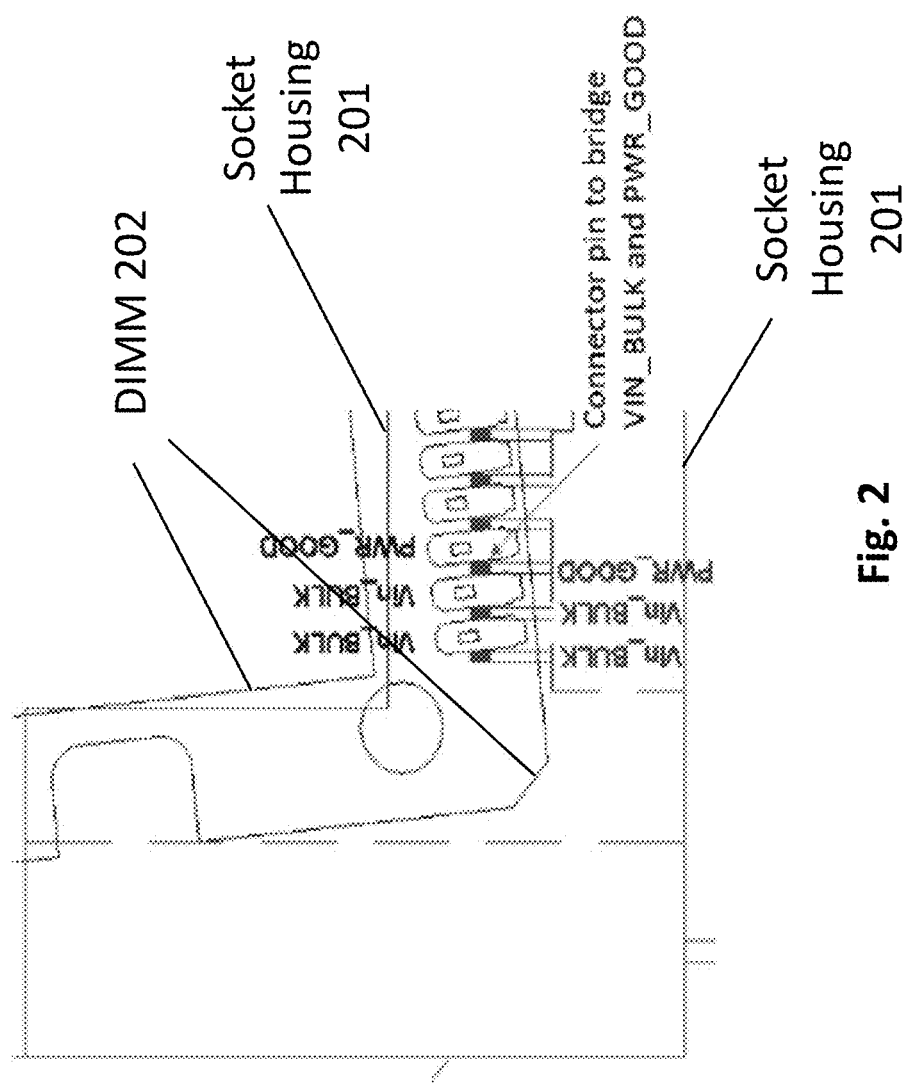
FIG. 2 show a problem that can occur with a DIMM/motherboard release dynamic.

FIG. 2 shows a zoom-in of the problem in more detail. As observed in FIG. 2, subtle rotation of the DIMM during release of the DIMM from the socket, causes a corner of the DIMM (not shown) to at least partially pull out of the socket. The rotation, in turn, causes the opposite corner of the DIMM (depicted in FIG. 2) to rotate within the socket. The rotation of the DIMM corner within the socket can bend pins at the far end of the I/O pin array. In some cases a bent pin will touch a neighboring pin, where, the two pins provide different voltages. For example, a first pin having a Vin_BULK voltage could touch a second pin having a PWR_GOOD voltage.

Importantly, the touching of these two voltage pins can damage the circuitry on the motherboard that provides these voltages. That is, the subtle rotation of the DIMM in the socket can result in a damaged motherboard, which, in turn results not only in a failure of a larger computing system, but also, the computer system's most expensive component.

Figure 3A:
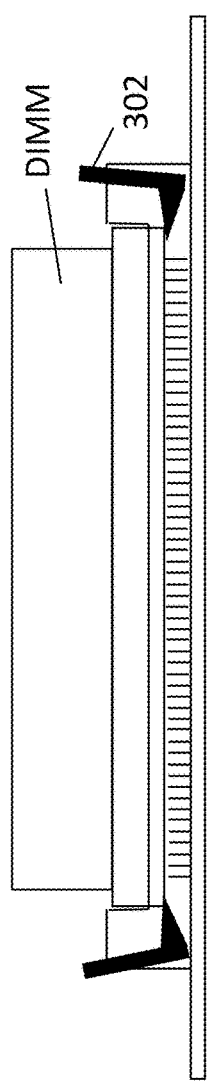
FIGS. 3a and 3b show a first uneven DIMM release dynamic.
Figure 3B:
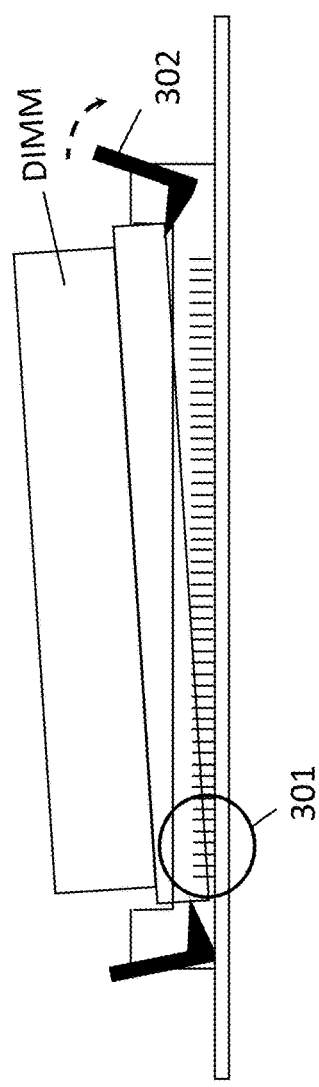

FIGS. 3a and 3b depict the problematic release dynamic in more detail. As observed in FIG. 3a, the DIMM is fully seated within the socket. In FIG. 3b, the DIMM is released from the socket with a counter-clockwise rotation. The counter-clockwise rotation could be the result, e.g., of the user applying more force to the lever arm of the right hand latch 302 than the lever arm of the left hand latch, the left hand side of the DIMM having greater frictional connection with the socket than the right hand side of the DIMM, some combination of the both, etc.

Regardless, the counter clockwise rotation of the DIMM during its release bends pins in the left hand region 301 of the socket. As discussed just above with respect to FIG. 2, specifically, either or both of a first pin in region 301 having a Vin_BULK voltage and a second pin in region 301 having a PWR_GOOD voltage can be bent during the rotation such that the two pins touch. The touching of the pins creates a short circuit that can damage circuitry on the motherboard.

FIGS. 4a and 4b show the opposite rotation dynamic. That is, FIG. 4a shows the DIMM fully seated in the socket and FIG. 4b shows the DIMM being released with a clockwise rotation. The clockwise rotation could be the result, e.g., of the user applying more force to the lever arm of the left hand latch 402 than the lever arm of the right hand latch, the right hand side of the DIMM having greater frictional connection with the socket than the left hand side of the DIMM, some combination of the both, etc.

However, unlike the scenario of FIGS. 3a and 3b in which pins are bent in region 301 causing a short circuit, by contrast, by contrast, in the scenario of FIGS. 4a and 4b no short circuits are created in region 403. That is, for example, within region 403, only pins of the same voltage bend or touch, the pin spacing is less dense such that neighboring pins do not touch, etc. Moreover, the rotation of the DIMM out of the socket on the right hand side does not cause any damage to pins in region 401 either.

As such, whereas the release dynamic of FIGS. 3a and 3b can damage pins in region 301, by contrast, the release dynamic of FIGS. 4a and 4b does not result in the damage of any pins.

FIGS. 5a and 5b therefore depict an improved socket that is designed to force the type of DIMM rotation during release that does not result in any damage. That is, the socket is designed such that the DIMM's release dynamics will be like that of FIGS. 4a, 4b and not like that of FIGS. 3a,3b.

In order to force such a release dynamic, as can be seen in FIGS. 5a and 5b, the right hand side latch 501 does not include a lever arm, push button or other extension or feature of the latch for a user to apply force upon in order to release the DIMM. By contrast, the left hand latch 502 includes such a feature. As such, when the user releases the DIMM, the user is only able to apply force to the left hand side latch 502 and is not able to apply force to the right hand side latch. The uneven application of force causes the left hand latch 502 to rotate and drive the left hand side of the DIMM out of the socket, while, the right hand latch 501 does not rotate which keeps the right hand side of the DIMM within the socket. The release of the left hand side of the DIMM from the socket, but not the right hand side, corresponds to clockwise rotation of the DIMM. As such, the release dynamic of FIGS. 4a and 4b is effected.

FIG. 6 shows an embodiment of the right hand side latch of FIGS. 5a and 5b. A standard prior art latch is also depicted for comparison. As can be seen, the latch 601 to be used in the improved approach does not include a feature for a user to press down upon. By contrast, the prior art latch includes a feature 602 (push button or extension from the lever arm) for a user to press down upon. By designing a socket with both latch types, the user will only be able to apply force to the latch having the feature 602, which, in turn, will cause the DIMM to rotate about a pivot axis that is proximate to the latch 601 that does not have the feature.

Figure 7A:
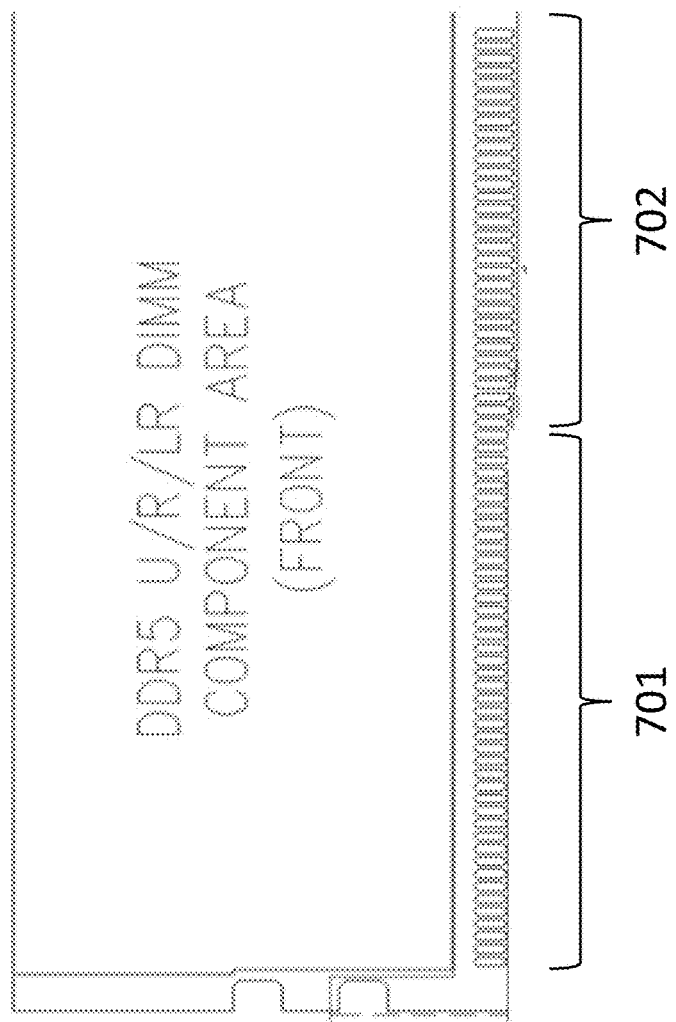
Figure 7C:
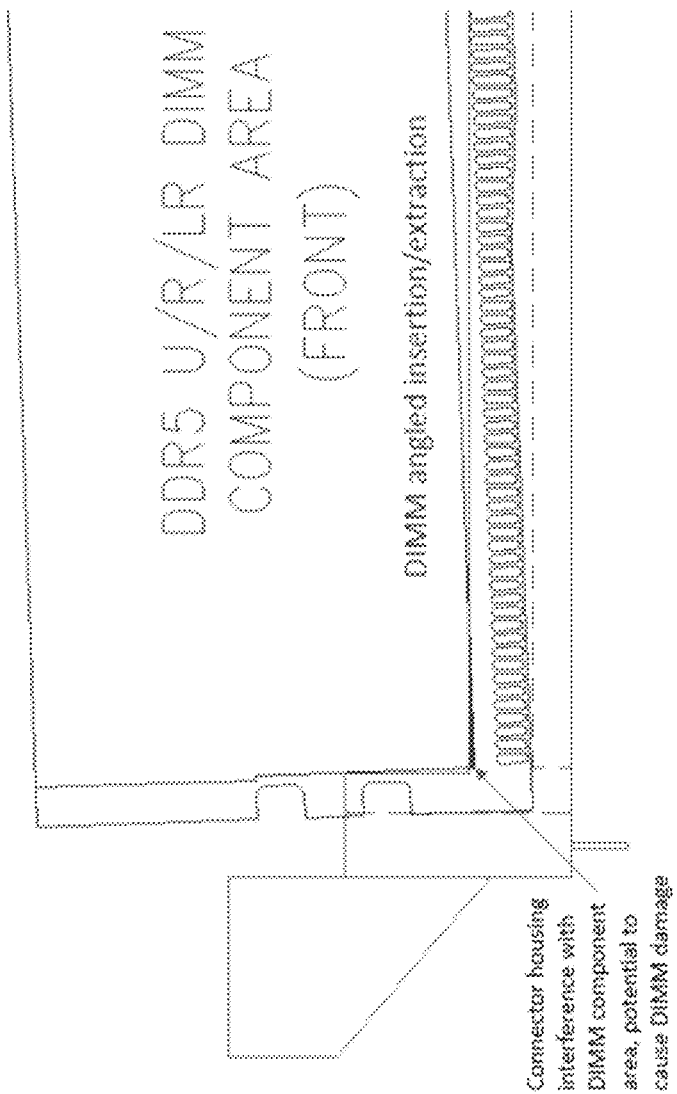

FIGS. 7a, 7b and 7c depict another problem associated with rotation of a DIMM that can result in damage to certain socket pins. FIG. 7a shows a traditional DIMM. As observed in FIG. 7a, the DIMM's contacts are designed with different lengths. Specifically, the contacts in region 702 are longer than the contacts in region 701. The longer contacts of region 702 achieve secure mechanical/electrical connection between the DIMM and the motherboard. However, if the full length of the DIMM were implemented with contacts of the longer length, it would be difficult to fully insert the DIMM into the socket (as the number of longer length contacts increases, the insertion force needed to press the DIMM into the socket increases). As such, in order to keep the insertion force needed to press the DIMM into the socket within reasonable limits, DIMM contacts toward the ends of the DIMM, such as contacts in region 701, are made shorter than the longer contacts.

A problem, however, as observed in FIGS. 7a and 7b, is the socket's seating floor for the DIMM. A socket seating floor is a floor within the socket that the DIMM is supposed to stand upon. The socket's seating floor essentially acts as a stop for the DIMM when the DIMM is being pressed into the socket (the DIMM cannot be pressed into the socket any further when the DIMM meets the seating floor). Unfortunately, the seating floor does not account for the different length contacts of the DIMM. FIG. 7b shows a DIMM that is fully inserted into a socket 710. The seating floor 711 within the socket (represented by dashed line 711) remains "flat" or "straight horizontal" beneath the DIMM, without any deviation therefrom, from one end of the DIMM all the way to opposite end of the DIMM. As such, in the region 701 of the DIMM's shorter length contacts, there exists a gap 712 between the seating floor 711 and the shorter length contacts. This gap can result in rotation of the DIMM, as observed in FIG. 7c, that damages socket pins as described at length above with respect to FIGS. 3a and 3b.

A solution is observed in FIGS. 8a and 8b. As observed in FIGS. 8a and 8b, the seating floor 810 is designed to be "raised" in the region 801 of the shorter length contacts. By raising the floor 810 in the region of the shorter length contacts the aforementioned gap is removed. As such, ideally, all contacts meet the floor 810 or are stopped by the floor 810 during insertion of the DIMM into the socket. Additionally, pin damaging rotation of the DIMM should not occur because, ideally, there is no gap between the shorter length contacts and the floor 810 (there is no open space beneath the shorted length contacts for the DIMM end to rotate into).

Embodiments may exist that combined both DIMM rotation related features described above. That is, for example, embodiments may exist where the socket not only includes a latch that does not have a feature to press down upon (as in FIGS. 5a and 5b) during release of the DIMM, but also, includes a seating floor having a profile that is designed to meet/stop a DIMM having contacts of differing lengths along the run-length of the DIMM where the DIMM's contacts reside (as in FIGS. 8a and 8b). Embodiments can also exist where the socket includes only one of the features.

Figure 9:
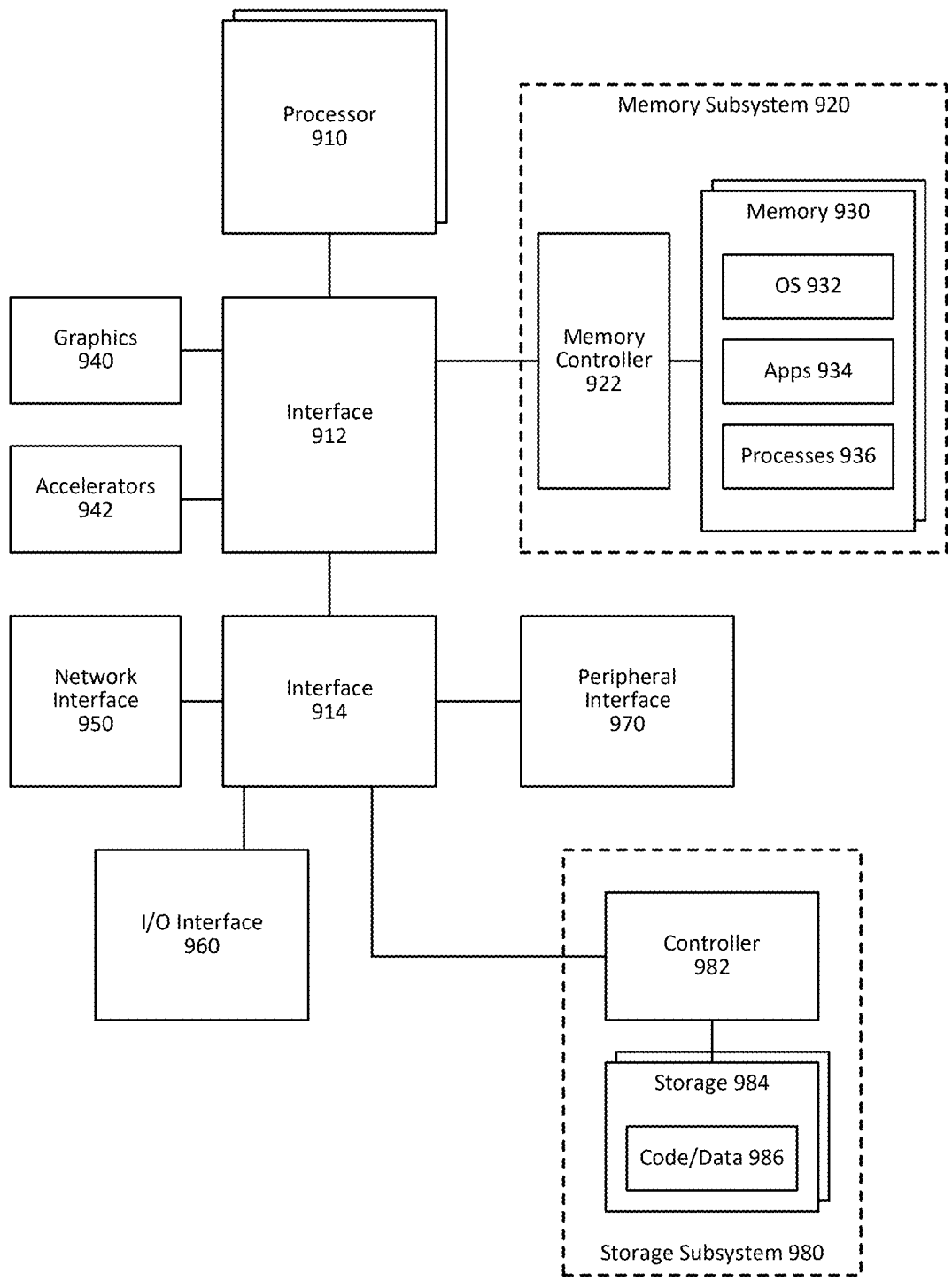
FIG. 9 shows a system.

FIG. 9 depicts an example system. The system can use the teachings provided herein. System 900 includes processor 910, which provides processing, operation management, and execution of instructions for system 900. Processor 910 can include any type of microprocessor, central processing unit (CPU), graphics processing unit (GPU), processing core, or other processing hardware to provide processing for system 900, or a combination of processors. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 900 includes interface 912 coupled to processor 910, which can represent a higher speed interface or a high throughput interface for system components that needs higher bandwidth connections, such as memory subsystem 920 or graphics interface components 940, or accelerators 942. Interface 912 represents an interface circuit, which can be a standalone component or integrated onto a processor die. Where present, graphics interface 940 interfaces to graphics components for providing a visual display to a user of system 900. In one example, graphics interface 940 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 940 generates a display based on data stored in memory 930 or based on operations executed by processor 910 or both. In one example, graphics interface 940 generates a display based on data stored in memory 930 or based on operations executed by processor 910 or both.

Accelerators 942 can be a fixed function offload engine that can be accessed or used by a processor 910. For example, an accelerator among accelerators 942 can provide compression (DC) capability, cryptography services such as public key encryption (PKE), cipher, hash/authentication capabilities, decryption, or other capabilities or services. In some embodiments, in addition or alternatively, an accelerator among accelerators 942 provides field select controller capabilities as described herein. In some cases, accelerators 942 can be integrated into a CPU socket (e.g., a connector to a motherboard or circuit board that includes a CPU and provides an electrical interface with the CPU). For example, accelerators 942 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 942 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 920 represents the main memory of system 900 and provides storage for code to be executed by processor 910, or data values to be used in executing a routine. Memory subsystem 920 can include one or more memory devices 930 such as read-only memory (ROM), flash memory, volatile memory, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

The memory 930 could be implemented with DIMMs that plug into sockets designed to release one end of the DIMM before the other end of the DIMM during release of the DIMM as described above, and/or, have a seating floor that meets shorter length contacts as described above.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 900 includes interface 914, which can be coupled to interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can transmit data to a remote device, which can include sending data stored in memory. Network interface 950 can receive data from a remote device, which can include storing received data into memory. Various embodiments can be used in connection with network interface 950, processor 910, and memory subsystem 920.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (e.g., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (e.g., the value or state of the data is indeterminate if power is interrupted to system 900). In one example, storage subsystem 980 includes controller 982 to interface with storage 984. In one example controller 982 is a physical part of interface 914 or processor 910 or can include circuits or logic in both processor 910 and interface 914.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 900. More specifically, power source typically interfaces to one or multiple power supplies in system 900 to provide power to the components of system 900. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 900 can be implemented as a disaggregated computing system. For example, the system 900 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 10:
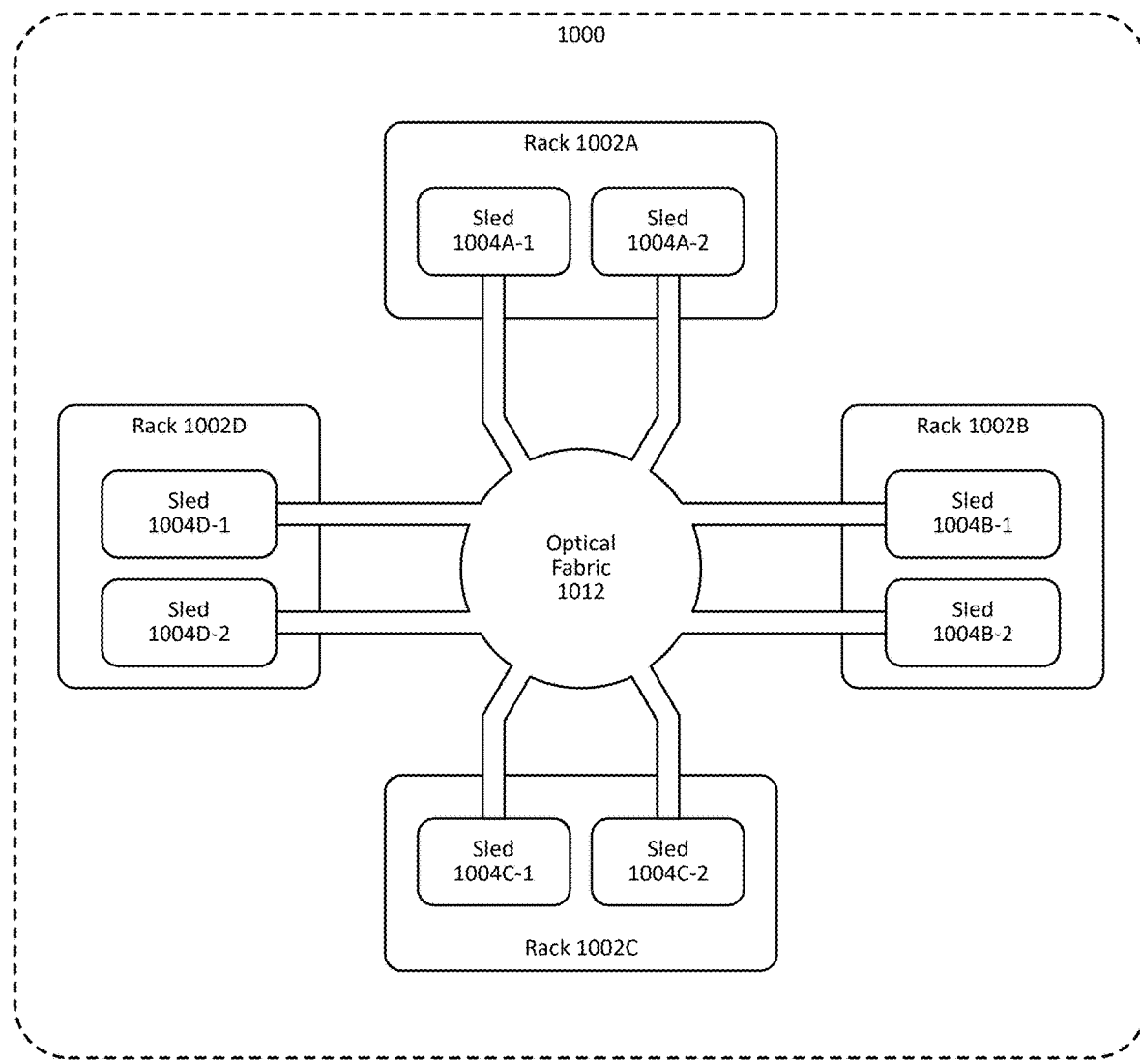
FIG. 10 shows a data center.

FIG. 10 depicts an example of a data center. Various embodiments can be used in or with the data center of FIG. 10. As shown in FIG. 10, data center 1000 may include an optical fabric 1012. Optical fabric 1012 may generally include a combination of optical signaling media (such as optical cabling) and optical switching infrastructure via which any particular sled in data center 1000 can send signals to (and receive signals from) the other sleds in data center 1000. However, optical, wireless, and/or electrical signals can be transmitted using fabric 1012. The signaling connectivity that optical fabric 1012 provides to any given sled may include connectivity both to other sleds in a same rack and sleds in other racks. Data center 1000 includes four racks 1002A to 1002D and racks 1002A to 1002D house respective pairs of sleds 1004A-1 and 1004A-2, 1004B-1 and 1004B-2, 1004C-1 and 1004C-2, and 1004D-1 and 1004D-2. Thus, in this example, data center 1000 includes a total of eight sleds. Optical fabric 1012 can provide sled signaling connectivity with one or more of the seven other sleds. For example, via optical fabric 1012, sled 1004A-1 in rack 1002A may possess signaling connectivity with sled 1004A-2 in rack 1002A, as well as the six other sleds 1004B-1, 1004B-2, 1004C-1, 1004C-2, 1004D-1, and 1004D-2 that are distributed among the other racks 1002B, 1002C, and 1002D of data center 1000. The embodiments are not limited to this example. For example, fabric 1012 can provide optical and/or electrical signaling.

Figure 11:
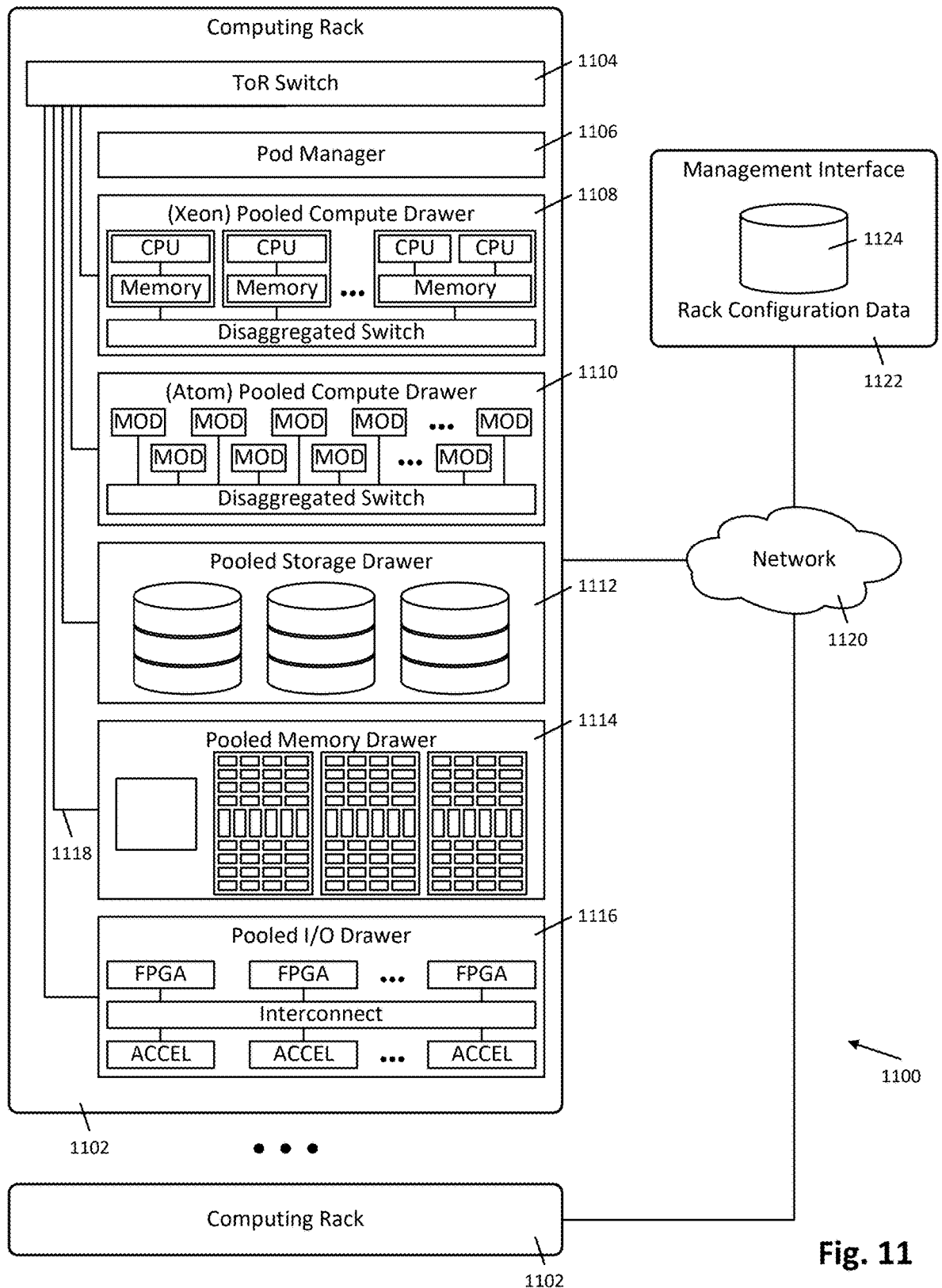
FIG. 11 shows a rack.

FIG. 11 depicts an environment 1100 includes multiple computing racks 1102, each including a Top of Rack (ToR) switch 1104, a pod manager 1106, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 1108, and INTEL® ATOM™ pooled compute drawer 1110, a pooled storage drawer 1112, a pooled memory drawer 1114, and an pooled I/O drawer 1116. Each of the pooled system drawers is connected to ToR switch 1104 via a high-speed link 1118, such as a 40 Gigabit/second (Gb/s) or 100 Gb/s Ethernet link or an 100+Gb/s Silicon Photonics (SiPh) optical link. In one embodiment high-speed link 1118 comprises an 1100 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 1100 may be interconnected via their ToR switches 1104 (e.g., to a pod-level switch or data center switch), as illustrated by connections to a network 1120. In some embodiments, groups of computing racks 1102 are managed as separate pods via pod manager(s) 1106. In one embodiment, a single pod manager is used to manage all of the racks in the pod. Alternatively, distributed pod managers may be used for pod management operations.

RSD environment 1100 further includes a management interface 1122 that is used to manage various aspects of the RSD environment. This includes managing rack configuration, with corresponding parameters stored as rack configuration data 1124.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

An apparatus has been described. The apparatus includes a dual-in line memory module (DIMM) socket having a first latch and a second latch, one of the first latch and the second latch has a feature for a user to apply force to release a DIMM from the DIMM socket. The other of the first latch and the second latch do not have a feature for the user to apply force so that one end of the DIMM releases before an opposite end of the DIMM during release of the DIMM from the socket.

In an embodiment, first and second contacts toward the one end of the DIMM are to respectively mate with socket pins having different voltages. In a further embodiment the socket pins are neighboring socket pins. In another further embodiment the socket does not comprise pins having different voltages that will short circuit in a region of the socket that mates with contacts of the DIMM toward the opposite end of the DIMM.

In an embodiment the DIMM and socket support a dual data rate memory channel. In a further embodiment the dual data rate memory channel is compatible with a JEDEC standard.

A computing system having the DIMM socket described above has been described.

A method has been described. The method includes receiving an ejective force at a button of a first latch at a first end of a DIMM having a buttonless second latch at a second end of the DIMM so that the first end of the DIMM releases from a socket that the DIMM is plugged into before the second end of the DIMM releases from the latch.

In an embodiment, first and second contacts toward the first end of the DIMM are to respectively mate with socket pins having different voltages. In a further embodiment the socket pins are neighboring socket pins. In another further embodiment the socket does not comprise pins having different voltages that will short circuit in a region of the socket that mates with contacts of the DIMM toward the opposite end of the DIMM.

In an embodiment the DIMM and socket support a dual data rate memory channel. In a further embodiment the dual data rate memory channel is compatible with a JEDEC standard.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a dual-in line memory module (DIMM) socket having
a latch with a feature to release a DIMM from the DIMM socket in response to application of a force to the latch, an end of the DIMM during release of the DIMM from the DIMM socket; and
a seating floor to act as a stop for the DIMM inserted into the DIMM socket, the seating floor having a raised portion that slopes up from a center of the DIMM socket toward the latch, to cause shorter pins of the DIMM to sit against the seating floor at the same time as longer pins of the DIMM.

2. The apparatus of claim 1 wherein first and second contacts toward one end of the DIMM where the latch is located are to respectively mate with socket pins having different voltages.

3. The apparatus of claim 2 wherein the socket pins are neighboring socket pins.

4. The apparatus of claim 2 wherein the DIMM socket does not comprise pins having different voltages that will short circuit in a region of the socket that mates with contacts of the DIMM toward an end of the DIMM opposite the latch.

5. The apparatus of claim 1 wherein the DIMM socket supports a dual data rate memory channel.

6. The apparatus of claim 5 wherein the dual data rate memory channel is compatible with a JEDEC standard.

7. A computing system, comprising:
a plurality of processing cores;
a network interface;
a memory controller; and,
a memory coupled to the memory controller, the memory comprising a dual-in line memory module (DIMM) socket having
a latch with a feature to release a DIMM from the DIMM socket in response to application of a force to the latch, an end of the DIMM during release of the DIMM from the DIMM socket; and
a seating floor to act as a stop for the DIMM inserted into the DIMM socket, the seating floor having a raised portion that slopes up from a center of the DIMM socket toward the latch, to cause shorter pins of the DIMM to sit against the seating floor at the same time as longer pins of the DIMM.

8. The computing system of claim 7 wherein first and second contacts toward one end of the DIMM where the latch is located are to respectively mate with socket pins having different voltages.

9. The computing system of claim 8 wherein the DIMM socket pins are neighboring socket pins.

10. The computing system of claim 8 wherein the DIMM socket does not comprise pins having different voltages that will short circuit in a region of the socket that mates with contacts of the DIMM toward an end of the DIMM opposite the latch.

11. The computing system of claim 7 wherein the DIMM socket supports a dual data rate memory channel.

12. The computing system of claim 11 wherein the dual data rate memory channel is compatible with a JEDEC standard.

13. The apparatus of claim 1 wherein the DIMM socket has the raised portion on one end and a flat portion on the other end.

14. The computing system of claim 11 wherein the DIMM socket has the raised portion on one end and a flat portion on the other end.

* * * * *